United States Patent [19]

Van Ness et al.

[11] 4,234,920
[45] Nov. 18, 1980

[54] POWER FAILURE DETECTION AND RESTART SYSTEM

[75] Inventors: Bradford O. Van Ness, Paradise Valley; Dan G. Weimer, Scottsdale, both of Ariz.

[73] Assignee: Engineered Systems, Inc., Tempe, Ariz.

[21] Appl. No.: 963,315

[22] Filed: Nov. 24, 1978

[51] Int. Cl.³ .................. G06F 11/00; G11C 7/02
[52] U.S. Cl. ................................... 364/200
[58] Field of Search .................. 365/228, 229; 364/200 MS File, 900 MS File; 235/303; 361/90; 324/51, 142

[56] References Cited
U.S. PATENT DOCUMENTS

| | | | |
|---|---|---|---|
| 3,167,685 | 1/1965 | Bade et al. | 364/200 |
| 3,321,747 | 5/1967 | Adamson | 364/200 |
| 3,624,617 | 11/1971 | Putterman et al. | 364/200 |
| 3,801,963 | 4/1974 | Chen | 364/200 |
| 3,810,116 | 5/1974 | Prohofsky | 365/228 |
| 3,937,937 | 2/1976 | McVey | 364/200 |
| 3,959,778 | 5/1976 | Brette | 364/200 |
| 4,096,560 | 6/1978 | Footh | 365/228 |

OTHER PUBLICATIONS

Houdek and Slack, "Auto Initial Microprogram Load", IBM Tech. Discl. Bull. vol. 19, No. 11 Apr. 1977, pp. 4339–4346.

Millman and Halkias, *Integrated Electronics: Analog and Digital Circuits and Systems,* 1972, pp. 583–585.

*Primary Examiner*—Gareth D. Shaw
*Assistant Examiner*—E. Chan
*Attorney, Agent, or Firm*—LaValle D. Ptak

[57] ABSTRACT

A power failure detection and restart system for use with a microprocessor (microcomputer) control system includes first and second cascaded voltage comparators, the first of which responds to a drop in the supply voltage supplied to the microprocessor to produce an output pulse causing a software freeze of the microprocessor. The microprocessor operates in response to the software freeze pulse to transfer the contents of certain registers thereof to a battery protected memory for temporary storage therein. A positive feed-back circuit is used on the first voltage comparator to insure its rapid and complete change of state; and this change of state signal is applied through a time delay circuit to the second voltage comparator, which produces an output signal a predetermined time after the software freeze pulse is obtained from the first voltage comparator to reset the microprocessor to an initial circuit condition. Built in hysteresis in the system is employed; so that when the power once again rises above the level sufficient to properly operate the system, the first and second voltage comparators are turned on in the same sequence they were turned off to re-establish operation of the microprocessor which picks up its routine at the point the interruption took place.

6 Claims, 4 Drawing Figures

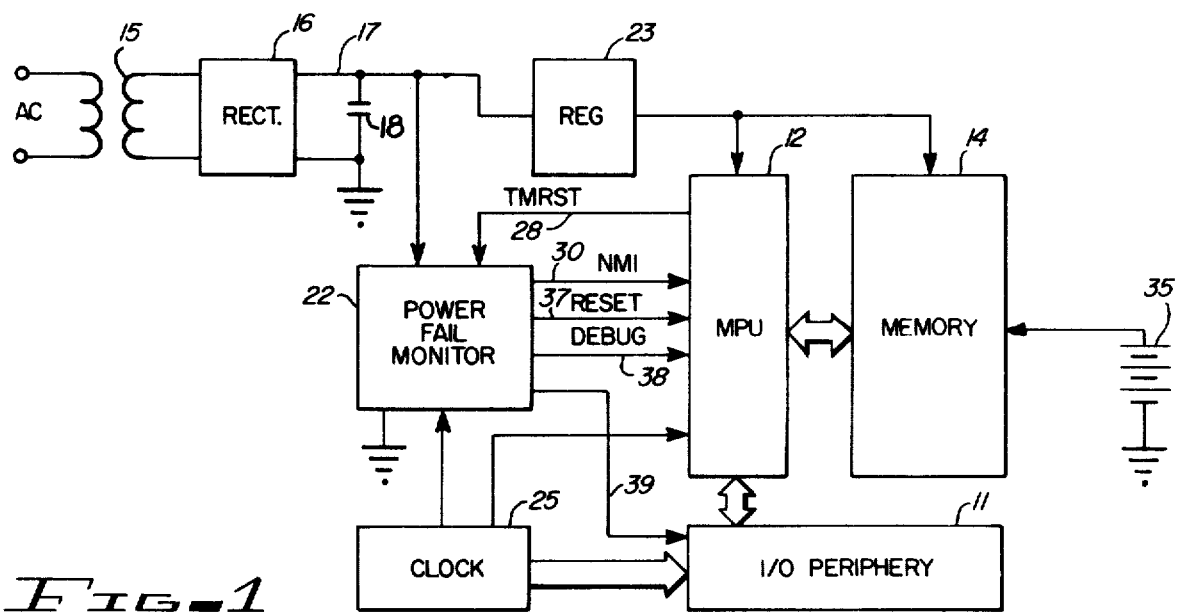
F I G - 1
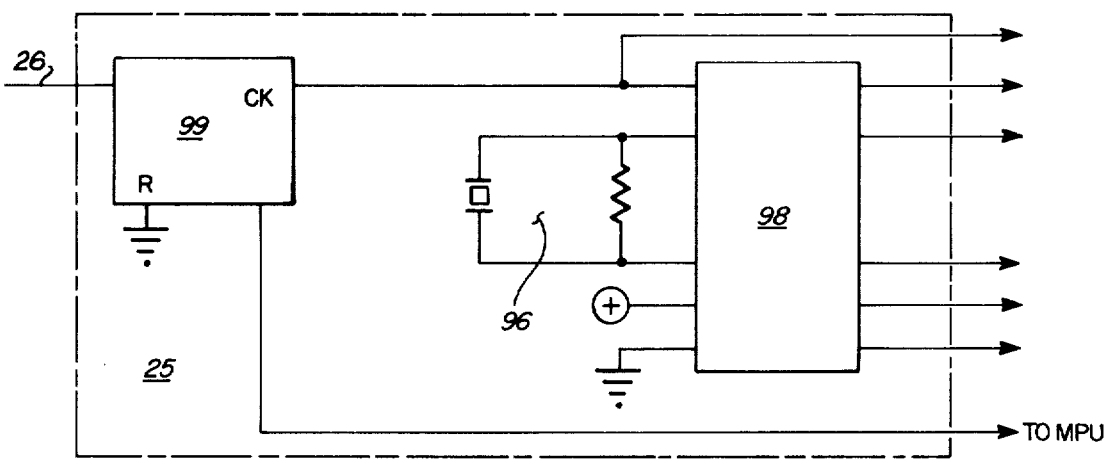
F I G - 2 B
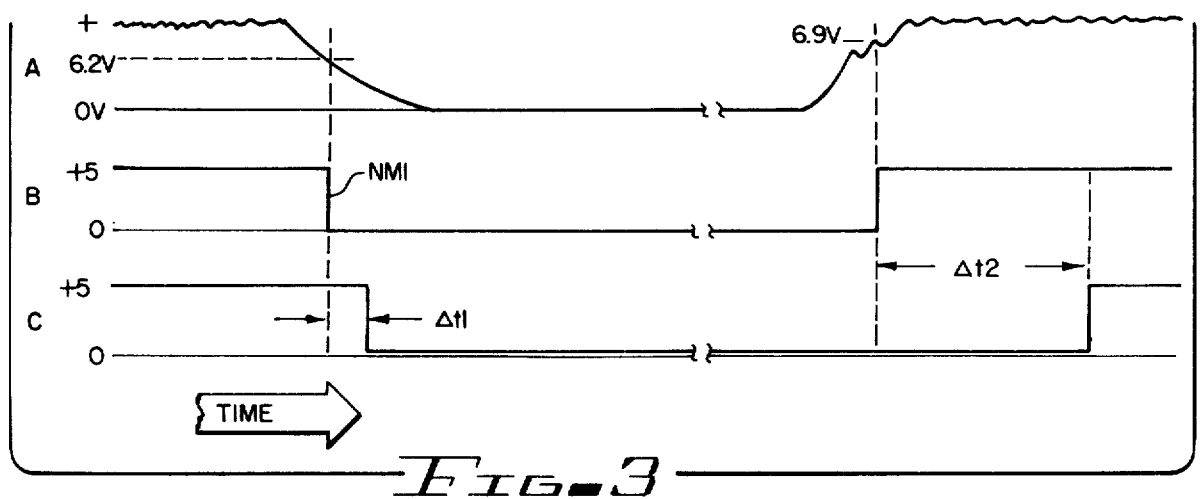
F I G - 3

POWER FAILURE DETECTION AND RESTART SYSTEM

BACKGROUND OF THE INVENTION

With low-cost computers and microprocessor units now available as relatively inexpensive system building-blocks, a large number of different control systems utilizing such microprocessors or computers have been developed. The applications of microprocessor controlled systems are practically limitless, since the flexibility which is afforded by the use of microprocessors through various types of software programming makes control systems using microprocessors as the heart of such systems highly attractive. For example, microprocessor controlled systems are utilized in industry for preprogrammed control of the operation of large automated or semi-automated assembly lines and the various machines used in conjunction with those assembly lines. Other applications include the use of microprocessor controlled systems for automatic fuel transfer or bulk terminal systems, where the microprocessor controls the turning on and off of valves used to control the storage of fuel, the transfer of fuel within the system, and the delivery of fuel from the system. In addition to these functions, the microprocessor controls other input/output devices to record the data necessary to monitor the operation and to provide automatic billing and accounting options and the like.

When such automated systems are working properly, they constitute a highly desirable substitute for the manual systems which they supplant. When something goes wrong with the operation of an automated system, however, serious problems can arise; so that it is necessary to build safeguards into the system against failure of the system to operate properly.

In the case of a microprocessor controlled system, one area in which such a system is susceptible to faulty operation is in the failure of the power supply to the microprocessor. This can be caused by an absolute complete interruption of power or by what has been frequently termed as a "brown-out" or other momentary power fluctuation. Whenever the power supplied to a microprocessor drops below some predetermined minimum level, the operation of a microprocessor no longer is reliable; and erratic, nonprogrammed, operations may result.

In a microprocessor controlled bulk terminal system, it is possible that erratic microprocessor operation could result in the turning on or leaving on of valves which otherwise should be turned off and which could result in dangerous spillage of fuel or other flammable materials. In addition, failure to turn on or turn off pump motors because of faulty operation of the microprocessor could also result in catastrophic failure of various electrical/mechanical components of the bulk terminal system. As a consequence, it is necessary whenever a microprocessor control unit is used in a bulk terminal system, or other automated or semi-automated control system, to monitor the input power voltage level and cause the system to shutdown if a power failure, temporary or semi-permanent, should occur. Generally such systems merely shutdown the system or place it in a "reset" mode of operation, aborting the program in process, whenever a power failure occurs.

Accordingly, it is desirable to provide a monitoring system for use with a microprocessor controlled control system which provides an orderly shutdown of the control system and the input/output devices employed with it in the event of a power failure. This shutdown ideally should first freeze the operating program at the point where it is interrupted and then electrically shutdown the microprocessor and peripheral equipment until power is resumed. In addition, it is desirable to provide a monitoring system with the capability of continuously monitoring the operation of the software program of the microprocessor to insure that the program is properly operating and to effect a shutdown of the system in the event that improper software program operation is taking place, irrespective of whether or not a power failure has occurred.

SUMMARY OF THE INVENTION

Accordingly, it is an object of this invention to provide an improved power failure detection system.

It is another object of this invention to provide an improved power failure detection system for use with a computer.

It is an additional object of this invention to provide an improved power failure detection system for use with a microprocessor which first provides a signal for freezing the software operation of the microprocessor in the event of a power failure and then a predetermined time later provides an output signal used to turn off the microprocessor.

It is a further object of this invention to provide an automatic monitoring and power failure detection system for providing an alarm signal to a microprocessor controlled system in the event faulty program operation of the microprocessor should occur or in the event a power failure should occur.

In accordance with a preferred embodiment of this invention, a power failure detection system for use with a microprocessor includes first and second comparators cascaded to one another. The power supply voltage to be monitored is supplied to the first comparator along with a reference voltage. Whenever the power supply attains a predetermined relationship with the referenced voltage (in response to a power failure), an output signal is obtained from the first comparator. This output signal is supplied to a second comparator through a time delay circuit. A reference voltage also is supplied to the second comparator and when the time delayed output signal from the first comparator reaches the second comparator, it produces an output signal. The output signals of both comparators are applied to appropriate inputs of the computer or microprocessor. In a specific embodiment of the invention, the first output signal from the first comparator is used to freeze the software operation of the microprocessor and transfer the contents of certain registers of the microprocessor to a battery protected memory. The output of the second comparator is applied to the microprocessor and to any input/output periphery equipment to turn off such equipment, this turn-off being effective only after the software freeze has taken place from the output of the first comparator.

In a more specific embodiment, the software program which is in process in the microprocessor continuously causes the microprocessor to apply clock or reset pulses to the monitoring circuit at regular intervals. Whenever a time interval longer than a predetermined interval occurs, the monitoring system causes the microprocessor to be shutdown, indicating erroneous operation of the program in process.

BRIEF DESCRIPTION OF THE DRAWINGS

FIG. 1 is a block diagram of a system using the monitoring circuit of the invention;

FIGS. 2A and 2B together comprise a detailed schematic diagram of a preferred embodiment of a monitoring circuit in accordance with the invention; and FIG. 3 shows waveforms useful in describing the operation of the system shown in FIG. 2.

DETAILED DESCRIPTION

Figure 2A:
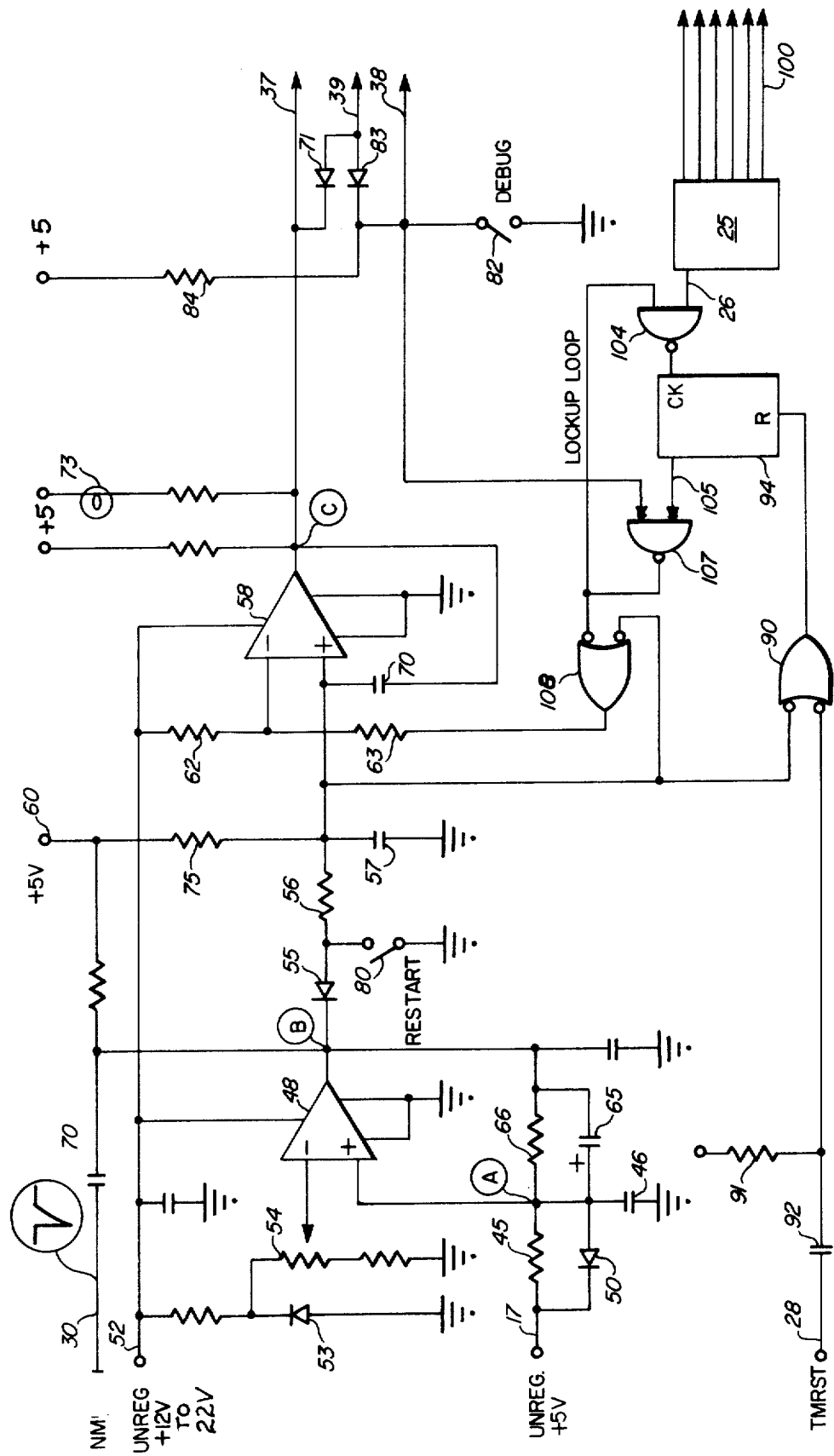

Before entering into a discussion of the circuit of the preferred embodiment of the invention shown in FIG. 2, a brief description of the overall system with which that circuit is used is given in conjunction with the block diagram of a typical control system using a microprocessor unit as shown in FIG. 1. Such a control system may be used in a number of different applications, typical of which are bulk terminal fuel systems. The operation of such bulk terminal fuel systems is effected through input/output periphery equipment 11 which supplies signals to, and which obtains signals from, a microprocessor or microcomputer 12. The microprocessor 12 may be any of a number of commercially available units, such as the Motorola 6802. Such a microprocessor 12 operation in response to a software program to provide various output signals to and from a battery protected memory 14 and to and from the input/output periphery equipment 11 in accordance with the program, as it is initiated in response to the application of signals to the microprocessor 12 from the periphery equipment 11.

Operating power for the microprocessor 12, and for other portions of the system, is typically obtained from an alternating current supply connected to the primary winding of a transformer 15. The secondary winding of the transformer 15 is connected to a rectifier 16, which produces an unregulated direct current voltage on an output lead 17. For the system shown in FIG. 1, and described in greater detail in conjunction with FIG. 2, the unregulated voltage appearing on the lead 17 is on the order of seven to ten volts. A capacitor 18 is connected between the lead 17 and ground to act as a ripple filter, as is typical with systems of this type. The unregulated direct current power appearing on the lead 17 is applied directly to a power fail monitoring circuit 22 and also is supplied to a direct current voltage regulator 23. The output of the regulator 23 then comprises the regulated typical 5 volt direct current power supply which is applied to the microprocessor 12 and the memory 14 to operate as a conventional power supply for these components.

A multiple output clock circuit 25 supplies clock pulses at various frequencies to the input/output periphery equipment 11, the microprocessor 12, and the power fail monitoring circuit 22. The clock circuit 25 includes a crystal oscillator and appropriate divider circuits to supply clock pulses at different frequencies on the various outputs shown extending from it in the circuit of FIG. 1 to the other components of the system. For the input/output periphery equipment 11, the clock pulses are selected to supply operating pulses at the desired baud rate of operation of that equipment as used in particular applications. The clock pulses applied to the microprocessor 12 are used to operate as time pulses for the microprocessor and are employed, in conjunction with the operation of the software programming of the microprocessor, to coordinate its operation with the operation of the input/output periphery equipment 11 and the operation of the power fail monitoring circuit 22.

Clock pulses also are supplied over the lead 26 to the power fail monitoring circuit 22 at a relatively low frequency (of the order of 25 Hz). These pulses are used by the power fail monitoring circuit 22, in conjunction with periodic reset pulses applied over a lead 28 from the microprocessor 12, to cause the power fail monitoring circuit to shutdown the system in the event that the periodic reset pulses fail to be applied to the power fail monitoring circuit 22 over the lead 28 from the microprocessor 12. Failure of these periodic reset pulses to appear on the lead 28 is indicative of failure of the microprocessor 12 to operate in accordance with its operating software program, and is indicative of a system operation failure, requiring a system shutdown by the power fail monitoring circuit 22.

As shown in FIG. 1, four different outputs are applied from the power fail monitoring circuit 22 to the microprocessor 12 and the input/output periphery equipment 11. The first of these outputs is applied over the lead 30, the "NMI" lead, and is supplied from the circuit 22 to the microprocessor 12 whenever the monitored voltage level of the power supplied on the lead 17 drops below some pre-established value. This signal on the lead 30 causes the microprocessor 12 to stop operation of the program then in progress (software freeze) and to transfer the data in the internal registers of the microprocessor 12 to corresponding appropriate sections of the battery protected memory 14. As shown in FIG. 1, the memory 14 is supplied with a normal operating voltage from the regulator 23; but in the event of a power failure, a battery 35 is used to maintain operation of the memory 14 until power from the power supply once again is supplied to the memory 14 at a normal operating level from the regulator 23.

A second output lead 37 from the circuit 22 is connected to the "RESET" input of the microprocessor 12. A pulse appearing on this lead is used to electrically turn off the microprocessor 12, following the transfer of information in its registers to the memory 14 as controlled by the earlier pulse on the lead 30. As is explained more fully subsequently, it is possible for pulses to be applied over the lead 37 without a pulse first appearing on the lead 30, in which event any information in process in the microprocessor 12 is not transferred to the memory 14; but the system is reset to start over its operation. Signals also may be applied over a lead 38 to the "DEBUG" input of the microprocessor 12. These signals are used for manual checking of the operation of the microprocessor 12 in a conventional "debugging" operation of a program by an operator.

In addition to the control signals applied to the microprocessor 12, the power fail monitor circuit 22 also supplies an output control signal over a lead 39 to the input/output periphery equipment 11 to turn off or place that equipment in a stand-by operation whenever a signal is applied to that equipment over the lead 39.

Reference now should be made to the detailed circuit diagram of FIGS. 2A and 2B the operation of which is described in conjunction with the waveforms of FIG. 3. The circuit of FIG. 2 comprises the power fail monitor circuit 22 and the clock circuit 25 of FIG. 1.

The unregulated direct current voltage supplied by the rectifier 16 is shown in FIG. 2 as applied over the lead 17 to the power fail monitor circuit. A ripple filter in the form of a resistor 45 and capacitor 46 are connected in conventional manner to the lead 17, and the output of the ripple filter is connected to the lower input of a two-input, operational amplifier, voltage comparator 48. The resistor 45 of the ripple filter is paralleled with a reverse-connected diode 50, which causes the operation of the ripple filter to be such as to hold the value of the voltage applied to the terminal of the comparator 48 near the lower side of the ripple voltage applied to the system over the lead 17. This is because the diode 50 blocks the positive-going fluctuations in the input waveform and rapidly passes the negative-going fluctuations.

The upper or reference input to the voltage comparator 48 is applied from a source of unregulated direct current voltage applied to a terminal 52. The voltage applied to this terminal is on the order of 17 to 22 volts D.C. and may be derived from the alternating current supply or from a local reference battery supply, as desired. This unregulated voltage then is applied through a voltage divider circuit including a zener diode 53 to establish a regulated reference voltage, the actual value of which, as applied to the upper terminal of the comparator 48, is established by the setting of a potentiometer 54. This setting, in a specific commercial application of the circuit shown in FIG. 2, is adjusted to establish a reference voltage of +5.97 volts on the upper terminal of the comparator 48. This voltage is selected for a system where the microprocessor 12 is supplied with a regulated +5 volt power supply for its operation.

Obviously, if a different power supply voltage is required by a particular microprocessor 12 (FIG. 1), a different reference voltage necessarily would need to be used and applied to the upper terminal of the comparator 48. Normally the voltage applied to the lower terminal of the comparator 48 is substantially above the reference voltage; so that the output of the comparator is a steady positive voltage of a predetermined value. This is the normal condition of operation of the monitoring circuit 22 when the power supply for the system shown in FIG. 1 is operating at or above a level sufficient to insure proper operation of the microprocessor 12.

In this normal condition of operation, a coupling diode 55 connects the output of the comparator 48 with a resistor-capacitor time delay network 56, 57 to the lower input of a second voltage comparator 58. Since the diode 55 is back-biased, the capacitor 57 is fully charged from a +5 volt operating potential applied to a terminal 60. The charge on the capacitor 57 in turn serves as the lower input to the comparator 58.

The upper input to the comparator 58 is obtained from a voltage divider consisting of a pair of resistors 62 and 63 coupled to the unregulated voltage input line 52 to supply approximately +2 volts to the upper or reference input terminal of the comparator 58. In this state of operation, the comparator 58 also produces a high or positive steady state output over its output terminal 37. This terminal 37 is connected to the "RESET" input to the microprocessor 12, as described above in conjunction with FIG. 1.

In FIG. 3, the left-hand portion of the waveforms A, B and C, to the left of the leftmost vertical dotted line, illustrate these steady state or normal conditions of operation of the circuit for the correspondingly labeled points in FIG. 2. Waveform A corresponds to the monitored direct current input 17, waveform B comprises the output of the comparator 48, and waveform C comprises the output of the second cascaded comparator 58.

In the event the monitored voltage applied to the lowermost input terminal of the comparator 48 falls below approximately 6.2 volts, the switching point indicated by the leftmost vertical dotted line in FIG. 3 is reached for the comparator 48. The operational amplifier comparator 48 then causes a change in the voltage level on its output from a steady state positive voltage level to a negative or near ground output voltage level.

To insure a rapid and sharp transition from the previous steady state output level to the new ground potential output level of the comparator 48, a positive feedback circuit is connected between the output of the comparator 48 and its lowermost input. This feedback circuit comprises a capacitor 65 and a resistor 66 connected in parallel with one another. The capacitor 65 applies a positive, regenerative immediate drop in potential from the output of the comparator 48 to its lower input terminal thereby fortifying the monitored drop in potential on the terminal 17 and driving the operational amplifier comparator 48 hard into its second or alarm state of operation. Because the positive feedback circuit is used, the amplifier 48 switches at approximately 6.2 volts input on the input lead 17, even though the reference voltage applied to the upper terminal of the comparator 48 is at 5.97 volts.

The sudden drop in potential at point B at the output of the comparator 48 is differentiated by a differentiating capacitor 70 to produce a sharp, negative-going pulse transition over the lead 30 to the microprocessor 12 (FIG. 1). This pulse is used by the specific microprocessor 12 described in conjunction with FIG. 1 to operate as a "software freeze" of the program being processed by the microprocessor 12 at the time the pulse arrives. In response to this pulse, microprocessor 12 stops further processing of the program, and causes the transfer of the data temporarily stored in the registers of the microprocessor 12 to the battery-protected memory 14, where it is indefinitely stored for subsequent recall by the microprocessor 12.

At the same time the negative-going signal transition at point B on the output terminal of the comparator 48 is applied through the now conductive diode 55 to the time delay circuit consisting of the resistor 56 and the capacitor 57. This permits the capacitor 57 to commence discharging through the resistor 56 and the diode 55 to ground potential. The rate at which this discharge takes place is dependent upon the size of the resistor 56, as is apparent from an examination of the circuit. The time delay is selected to permit the full transfer of the data in the registers of the microprocessor 12 to the memory 14 before the potential applied to the lower input of the second comparator 58 drops to the level of the reference voltage applied to its upper terminal. After the time delay, however, the output of the comparator 58 drops from its previous high output level to a near ground potential.

As is the case with the comparator 48, a positive feedback capacitor 70 is connected between the output of the comparator 58 and its lowermost input to insure that the signal transition change rapidly takes place. The time delay from the time the output of the comparator 48 first drops to a low potential to the time that the output of the comparator 58 drops to a low potential is illustrated in waveform C of FIG. 3 as Δt1. When the negative-going output pulse is applied from the output of the comparator 58 over the lead 37, it is used to electrically turn off the microprocessor unit 12 to prevent its further operation until the power failure has terminated. At the same time, a coupling diode 71 causes the negative-going signal also to be coupled over the output lead 39 to turn off the input/output periphery equipment 11 (FIG. 1). In a specific application, such as a bulk terminal system, this signal would be used to turn off various valves and the like to stop fuel flow from one part of the system to another, or stop delivery of fuel from the system, placing every portion of the system in a safe stand-by or "off" state of operation.

In addition to turning off the microprocessor 12 and the periphery equipment 11, the low or near ground potential at terminal C of the comparator 58 establishes a conductive path through a failure indicating lamp 73 to turn on the lamp. The lamp 73 may be located in a convenient position to permit an operator of the system to know that the system has been shutdown due to a power failure output indication from the monitoring system. So long as the condition of operation which initiated the sequence described above continues to persist, the system remains shutdown, with low or negative outputs obtained from both of the comparators 48 and 58. This condition of operation is shown in the portion of the waveforms A, B and C of FIG. 3 immediately to the right of the broken lines located near the center of the drawing.

Now assume that the power failure has terminated and that potential of a sufficient level to operate the system once again appears on the unregulated terminal 17 from the output of the rectifier 16. A resumption of an appropriate operating signal level is shown in the rising portion of the waveform A shown immediately to the right of the broken line in FIG. 3. When the potential on the terminal 17 reaches a level of approximately 6.9 volts (for the example under consideration) the output of the voltage comparator 48 switches from its low level to its high level.

Once again the positive feedback causes a regenerative action to take place to insure this level is switched rapidly and efficiently. The positive feedback circuit also, through the resistor 66, provides a turn-on hysteresis resulting in the necessity of an attainment of a higher voltage level on the lead 17 to turn the voltage comparator 48 back on (to its high output condition) then is required to turn it "off" from its high to its low output level. This is done to prevent chattering or false operation of the power failure monitoring circuit 22 during the first few cycles of the rectified output of the alternating current input signal during the start-up condition of operation. As is well known, there is a slight ripple in the direct current output of the rectifier 16; so that if the hysteresis were not provided, it is possible, depending upon which part of the input AC waveform the startup occurred, to have a false shutdown operation occurring immediately after startup of the system. This would be a highly undesirable condition. Thus, the use of the resistor 66 provides the desired hysteresis to insure consistent and reliable operation of the system.

The positive-going signal transition at the output of the comparator 48 has no effect on the "software freeze" input applied over the lead 30 to the microprocessor 12 since that input responds only to sharp negative-going differentiating pulses of the type described previously in conjunction with the system operation when a power failure occurs. The positive output of the comparator 48, however, once again back-biases the diode 55; so that the capacitor 57 once again may commence charging through a resistor 75 toward the potential applied to it from the terminal 60. The time required for the capacitor 57 to charge up to a level sufficient to cause a change in the output of the comparator 58 is illustrated in FIG. 3 as $\Delta t2$ and is a relatively long time period (on the order of 0.1 seconds). This time delay is established to permit the microprocessor 12 to reinitialize its sequence of operation. Typically, the time delay allows approximately 8 or more system cycles of the microprocessor to occur to take care of the normal initializing operation functions of the microprocessor before it commences reoperation of the interrupted program.

When the signal at terminal C on lead 37 once again goes high, as indicated at the end of the time interval $\Delta t2$ in FIG. 3, the microprocessor 12 transfers the previously temporarily stored information from the memory 14 back into the registers where it was prior to the power failure shutdown and resumes operation of the interrupted program. This is effected by conventional software programming techniques and is a desired operation, since it does not require starting over at the beginning of the interrupted program. For many applications, to start over an interrupted program may be a physical impossibility. For example, in a bulk fuel transfer system, the program which was interrupted very well could already have effected the physical transfer of fuel from one point in the system to another and this interrupted transfer cannot be reversed or cannot be reversed easily. For such a system, it is desirable merely to resume the program effecting a transfer from the point at which it was interrupted; so that all of the system and bookkeeping operations controlled by the system shown in FIG. 1 are completed normally without the necessity for operator intervention.

At the same time that the signal level on the output lead 37 rises, the diode 71 is back-biased. This causes the signal level on the lead 39 once again to rise to permit the input/output periphery equipment 11 to resume its normal mode of operation at the point it was in at the time of the system interruption caused by the operation of the circuit 22 in response to the power failure.

The operation of the system which has been described above in conjunction with FIGS. 2 and 3, is the normal power failure monitoring operation of the system. Some other features, however, are incorporated into the system to expand its versatility. For example, if an operator observing the system operation notices an erratic behavior of the system being controlled without a power failure causing a system shutdown as described above, a normally open restart switch 80 can be closed to apply ground potential to the junction between the resistor 56 and the diode 55. This has the same effect, when it is applied to the time delay circuit 56 and 57 on the comparator, as the operation described above when the output of the comparator 48 goes low. Closure of the switch 80, however, overrides any output state of the comparator 48; so that it is not dependent upon the level of the power input applied to the system.

When the switch 80 is closed for a time interval sufficient to permit the time delay of the circuit 57 and 56 to be effective, the comparator 48 is caused to change its output level from positive (high) to negative (low), as described previously; and all of the operations described above which are controlled by that comparator are effected. Thus, the microprocessor 12 is recycled or reset; and the I/O periphery equipment 11 is deactivated so long as the restart switch 80 is closed. Since the output of the comparator 48 is bypassed at this time, however, no transfer of any data in the registers of the microprocessor 12 to the memory 14 is effected. This is desirable, since the restart switch 80 is only closed when there is something wrong with the operating program; and there is no desire or need to retain the erroneous data in process in the microprocessor 12. When the switch 80 is subsequently reopened, the microprocessor 12 and the input/output periphery equipment 11 commence normal operation under the control of the program which is being run. If once again, there is a program or operating failure, the restart switch 80 again may be closed. Generally if an error continues, it is necessary for maintenance of some type to be done on the system.

As with most microprocessor controlled systems, it is desirable to also permit the program to be manually inspected or altered; so that an operator can "debug" the system as he observes its operation. To permit this operation to be accomplished, a normally open "debug" switch 82 is connected to the junction between a diode 83 and a resistor 84, the other terminal of which is supplied with operating direct current potential. Normally the didoe 83 is back-biased and is of no effect in the system. When the switch 82, however, is closed, a near ground potential is applied to the output lead 39 which causes the input/output periphery equipment 11 to be turned off and made non-responsive to the output of the microprocessor 12. The isolating diode 71, for this mode of operation allows the potential on the lead 37 to be controlled from the output of the comparator 48; so that the microprocessor 12 may be operated. At the same time, the ground potential applied through the switch 82 is applied over the "debug" lead 38 to the microprocessor 12 to place it in its conventional debugging mode of operation. The manner in which the microprocessor 12 is operated in this mode will not be described here since it is independent of and not important to the understanding of the operation of the power failure monitor circuit. The portion of the debugging circuit input, however, which has been shown in FIG. 2 is illustrated to show the manner in which this input can be used to initiate a debugging operation of the microprocessor 12 in conjunction with and in a manner overriding the operation of the monitoring circuit.

The monitoring circuit 22 shown in FIG. 2 also is used to monitor the proper operation of the microprocessor 12 in the continuing processing of a pre-established program and to cause a shutdown of the microprocessor 12 in the event that that program is not being properly processed. As is well known, in the continuous correct processing of any software program by a microcomputer or microprocessor, the software program causes sequential steps to take place in the hardware operation of the microprocessor. It is possible, in the operation of any software program in a microprocessor, to build into that program, a periodic sub-routine to produce pulses as the different main routines of the program are sequenced through the computer. These pulses then can be used in conjunction with the circuit shown in FIG. 2, to constantly monitor the operation of the microprocessor. If a failure of proper operation of the software program by the microprocessor or computer should take place, that failure will be evidenced by the failure of the microprocessor to produce the periodic sub-routine pulses indicative of proper operation of the program.

In the system shown in FIG. 1, the microprocessor 12 is operated with a software program which produces periodic negative-going timer reset pulses on the lead 28 to the power fail monitoring circuit 22. These pulses are shown as applied to the correspondingly numbered input lead in the lower lefthand corner of FIG. 2 and are applied to the lower input of a two-input NOR gate 90. The upper input of the NOR gate 90 is obtained from the junction of the resistor 56 and the capacitor 57 in the delay circuit described previously, and this input is normally high since the capacitor 57 is normally charged. Since the length or duration of the input pulses applied over the lead 28 to the circuit of FIG. 2 may vary, a differentiating circuit comprising a resistor 91 and a capacitor 92 is employed to cause a sharp, short-duration, differentiated negative-going pulse as the input signal to the gate 90. Each time a pulse is passed by the NOR gate 90, a positive going output pulse is applied from the output of the gate 90 to a reset input terminal of a binary divider circuit 94 to reset the divider circuit to an initial count.

Operating in conjunction with the remainder of the circuit shown in FIG. 2A is the external time clock circuit 25 (FIG. 2B) which consists of a crystal oscillator 96 coupled to a multi-stage multi-output divider circuit 98 which has several different output terminals shown extending from the right hand side thereof at different frequencies for use by the input/output periphery equipment 11, according to the baud rate established for the various types of equipment which may be used. Any one or any various combination of the different frequency outputs from the circuit 98 may be employed in accordance with the particular characteristics of the peripheral equipment used.

In addition, one of the outputs of the divider circuit 98 is applied to a second binary divider circuit 99, which is allowed to run continuously to produce output signals at a frequency of 100 Hz on an output lead 100. This lead is connected to the input of the microprocessor 12 to synchronize the operation of the microprocessor 12 with the operation of the input/output periphery equipment 11 controlled by the same basis clock circuit shown in the circuit 25.

A second output from the divider 99 is applied at approximately a 25 Hz frequency over the lead 26 to the lower input of a two input NAND gate 104, the upper input of which is a normally high enabling input. These pulses then are passed through the NAND gate 104 to the clock input of the binary divider 94, which is set to produce an output on a lead 105 to the lower input of a second NAND gate 107 after counting a pre-established number of clock pulses applied to its input following a reset pulse.

The pulses applied from the microprocessor over the lead 28 for normal and correct operation of the microprocessor occur, in a typical example, approximately once each two and one half seconds. The binary divider circuit 94 is set to have a length sufficient to cause an output pulse to be applied over its output lead 105 after approximately 3 or 4 seconds, so that normally the reset pulses applied to the reset terminal of the divider 94 from the output of the NOR gate 90 occur at frequent enough intervals that no output pulse is obtained and applied over the lead 105.

In this condition of operation, the output of the normally enabled NAND gate 107 is high since the output on the lead 105 is a normal steady-state low signal. This high output is applied back to the NAND gate 104 to continuously enable that NAND gate and is also applied to one of the two inputs of a NOR gate 108.

The output of the NOR gate 108 is connected through the resistor 63 to the upper or reference input terminal of the comparator 58. The other input to the NOR gate 108 is obtained from the junction of the capacitor 57 with the resistor 56 and, as described previously, this is a normally high input. As a consequence, the output of the NOR gate 108 is normally low; so that the operation of the comparator 58 is as described previously in conjunction with the operation described for this portion of the circuit of FIG. 2.

Now assume that a failure of proper operation of the program by the microprocessor 12 occurs. Since the program is not processed by the microprocessor 12 in a normal manner, the sub-routine which produces the reset pulses applied on the lead 28 also fails to operate; and one or more of these reset pulses is missing. As a consequence, the divider 94 is not reset, as described previously; and a positive-going output pulse is applied over the lead 105 to the lower terminal of the NAND gate 107 after a sufficient number of clock pulses have been received from the output of NAND gate 104. This results in a negative-going output signal from the NAND gate 107, which disables the NAND gate 104 to prevent further operation of the divider 94. At the same time, the output of the NOR gate 108 is driven high, which raises the reference voltage input to the upper terminal of the comparator 58. This has the same effect as dropping the monitored or lower input voltage to the comparator 58, and results in the output of the comparator 58 being driven from its previously high to a low state. As described previously, this initiates shutdown of the microprocessor 12 and a resetting and turning off of the peripheral equipment 11.

Since the comparator 58 is turned off or caused to produce a low output while the comparator 48 continues its normal "high" output, there is no storage of any of the contents of any of the registers of the microprocessor 12 in the memory 14 for this occurrence. The system remains locked up in this manner because of the low output signal applied to the upper input of the NAND gate 104. It is necessary to manually restart the system by momentarily closing the restart switch 80 to reinitiate operation of the system, as described previously. In addition, the negative-going restart pulse is applied through the NOR gate 90 to the reset terminal of the binary divider 94. This causes the output signal on the lead 105 to go low, re-establishing a high output on the lead 107 to re-enable the NAND gate 104 and permit clock pulses once again to be applied through the gate 104 to the divider 94. The system operation then resumes and continues in the manner described above.

It should be noted that whenever the system is placed in its debug mode of operation, the NAND gate 107 is disabled; so that no shutdown of the system can occur by virtue of the time-out of the divider circuit 94. This is necessary since when the system is in a debugging mode of operation, the reset pulses on the lead 28 do not occur at the normal periodic frequency at which these pulses occur when the system is operating in its normal mode of operation.

The foregoing description of the operation of the system has been made in conjunction with the specific embodiment shown in FIG. 2. This embodiment of the invention is to be considered illustrative only and is not to be considered limiting of the scope of the invention as implemented by equivalent circuitry. The system permits accurate composite monitoring of the power supply voltage and of the proper program sequencing of the microprocessor and operates to interrupt the program and shutdown the computer or to shutdown the computer and reinitialize it or restart it in the event of power supply failure or program operating failure. The system requires a minimum number of components; and with the use of the two comparators and the positive feedback loops employed, is not subject to false operation during either the shutdown or turn-on modes of its operation.

We claim:
1. A power failure detection system for use with a computer including in combination:
   first means for supplying a voltage to be monitored;
   second means for supplying a predetermined reference voltage;
   first comparator means having inputs coupled with said first and second means and having an output for supplying a first output signal level when a predetermined normal relationship exists between the voltages supplied by said first and second means and providing a second output signal level when a predetermined abnormal relationship exists between the voltages supplied by said first and second means;
   third means for supplying a second predetermined reference voltage;
   time delay circuit means;
   second comparator means having one input coupled with said third means, having a second input coupled with the output of said first comparator means through said time delay circuit means, and having an output for supplying a first output signal level when the output of said first comparator means is at said first output signal level and for supplying a second output signal level a predetermined time after the signal on the output of said first comparator changes from the first signal level to the second signal level;
   computer means connected to the outputs for said first and second comparator means, said computer means interrupting operation in response to the change in the output signal level from said first comparator means from said first signal level to said second signal level, said computer means including timer circuit means coupled to said second comparator means for driving said second comparator means to produce the second output signal level on the output thereof in response to the output of said timer circuit means irrespective of the state of operation of said first comparator means; and
   means coupled with said computer means for receiving signals therefrom indicative of proper operation of said computer means for periodically resetting said timer circuit means to prevent said timer circuit means from driving said second comparator means to the state where it produces said second output signal level, where the second signal level on the output of said second comparator means resets said computer means to a predetermined state of operation.

2. The combination according to claim 1 including a battery protected memory; and wherein said computer means comprises a microprocessor having registers therein, and the output of said first comparator means produces a pulse to said microprocessor when the signal level on the output of first comparator means changes from said first signal level to said second signal level, said pulse causing said microprocessor to interrupt operation and to store the status of predetermined ones of said registers in said memory in response thereto.

3. A power failure detection system for use with a computer including in combination:
first means for supplying a voltage to be monitored;
second means for supplying a predetermined reference voltage;
first comparator means having inputs coupled with said first and second means and having an output for supplying a first output signal level when a predetermined normal relationship exists between the voltages supplied by said first and second means and providing a second output signal level when a predetermined abnormal relationship exists between the voltages supplied by said first and second means;
third means for supplying a second predetermined reference voltage;
time delay circuit means;
second comparator means having one input coupled with said third means, having a second input coupled with the output of said first comparator means through said time delay circuit means, and having an output for supplying a first output signal level when the output of said first comparator means is at said first output signal level and for supplying a second output signal level a predetermined time after the signal on the output of said first comparator changes from the first signal level to the second signal level;
a battery protected memory;
a microprocessor having registers therein, the output of said first comparator means producing a pulse to said microprocessor when the signal level on the output of said first comparator means changes from said first signal level to said second signal level, said pulse causing said microprocessor to interrupt operation and to store the status of predetermined ones of said registers in said memory response thereto, where the second signal level on the output of said second comparator means resets said microprocessor to a predetermined state of operation;
timer circuit means coupled to said second comparator means for driving said second comparator means to produce the second output signal level on the output thereof in response to an output pulse of said timer circuit means produced a predetermined time after said timer circuit means is reset; and
said microprocessor including means for supplying reset clock pulses to said timer circuit means at periodic intervals sufficient to reset said timer circuit means prior to said timer circuit means producing said output pulse thereof so long as the program operation of said microprocessor is correct.

4. The combination according to claim 3 wherein the predetermined abnormal relationship between the voltages supplied by said first and second means is caused by a drop in power supply voltage monitored by said first means and resumption of such power supply voltage back to a normal level causes said first and second comparator means to be reset to a state where both of said comparator means produce an output signal at said first level on the outputs thereof, whereby such output signal level applied to said microprocessor causes said microprocessor to resume operation of the program previously being processed thereby from the point at which such program was interrupted.

5. The combination according to claim 3 further including restart switch means coupled with said second comparator means for causing the output of said second comparator means to be forced to its second output signal level in response to operation of such restart switch means irrespective of the state of the output of said first comparator means, to thereby reset said microprocessor to an initial operating condition, said restart switch means also coupled with said timer circuit means for resetting said timer circuit means.

6. The combination according to claim 3 further including debugging switch means coupled with said microprocessor and coupled with said timer circuit means for disabling said timer circuit means so long as said microprocessor is in its debugging mode of operation in response to operation of said debugging switch means.

* * * * *